(12) United States Patent
Fan

(10) Patent No.: US 10,319,885 B2
(45) Date of Patent: Jun. 11, 2019

(54) DISPLAY DEVICE AND LED EMITTING LIGHT ON FOUR SIDES THEREOF

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 212 days.

(21) Appl. No.: 15/528,750

(22) PCT Filed: May 17, 2017

(86) PCT No.: PCT/CN2017/084694
§ 371 (c)(1),
(2) Date: May 22, 2017

(87) PCT Pub. No.: WO2018/184281
PCT Pub. Date: Oct. 11, 2018

(65) Prior Publication Data
US 2019/0097091 A1    Mar. 28, 2019

(30) Foreign Application Priority Data
Apr. 7, 2017    (CN) .......................... 2017 1 0223959

(51) Int. Cl.
*H01L 33/00*    (2010.01)
*H01L 33/48*    (2010.01)
(Continued)

(52) U.S. Cl.
CPC ............ *H01L 33/486* (2013.01); *H01L 33/60* (2013.01); *H01L 33/62* (2013.01)

(58) Field of Classification Search
CPC ........ H01L 33/486; H01L 33/60; H01L 33/62
(Continued)

(56) References Cited

U.S. PATENT DOCUMENTS 9,620,686 B2 * 4/2017 Steckel ................... H01L 33/60
2004/0069999 A1 4/2004 Lin et al.
(Continued)

FOREIGN PATENT DOCUMENTS

CN    103400921 A    11/2013
CN    203312357 U    11/2013
(Continued)

*Primary Examiner* — Tan N Tran
(74) *Attorney, Agent, or Firm* — Andrew C. Cheng

(57) ABSTRACT

The disclosure provides a display device and a LED emitting light on four sides thereof. The LED emitting light on four sides includes metallic substrates, a blue chip, golden lines, light emitting materials and a reflective white adhesive layer. The metallic substrates include a first metallic substrate and a second metallic substrate. A transparent holder is fixated with the first metallic substrate and the second metallic substrate, forming a containing cavity. A light emitting chip is across disposed on the first metallic substrate and the second metallic substrate. The light emitting materials are filled in the containing cavity and covering the blue chip. The reflective white adhesive layer is disposed on a top surface of the light emitting materials. The LED emitting light on four sides provided by the disclosure is simply manufactured and low in costs.

19 Claims, 6 Drawing Sheets

(51) Int. Cl.
*H01L 33/62* (2010.01)
*H01L 33/60* (2010.01)

(58) Field of Classification Search
USPC .......................................... 257/98, 99, 100
See application file for complete search history.

(56) References Cited

U.S. PATENT DOCUMENTS

| 2009/0045421 A1 | 2/2009 | Ho et al. |
| 2012/0256213 A1 | 10/2012 | Chang et al. |
| 2013/0256721 A1 | 10/2013 | Chang |
| 2014/0239326 A1 | 8/2014 | Perng |

FOREIGN PATENT DOCUMENTS

| CN | 205645868 U | 10/2016 |
| CN | 106531857 A | 3/2017 |
| EP | 1113506 A2 | 7/2001 |
| EP | 1249877 A2 | 4/2002 |
| JP | 2008252135 A | 10/2008 |
| KR | 1020110052937 A | 5/2011 |

* cited by examiner

DISPLAY DEVICE AND LED EMITTING LIGHT ON FOUR SIDES THEREOF

TECHNICAL FIELD

The disclosure relates to a LED technical field, and more particularly to a display device and a LED emitting light on four sides thereof.

DESCRIPTION OF RELATED ART

A thin and large high-dynamic range (HDR) television has been a critical model of high-end televisions. With respect to the HDR television, single light control region is approaching rectangle when the backlight has more sub regions, and the HDR is better in theory.

As a conventional direct-lit type light emitting diode (LED) has only one light emitting surface, the light control region will be quite narrow if no secondary lens is used. Direct-lit type backlight LEDs generally have the secondary lens to extend the light control region for achieving an objective of reducing the number of lamps and costs as a result.

But the addition of the secondary lens will increase costs of the lens, and the light control region is similar to round rather than rectangle.

Intervals of the LED is larger compared with a conventional LED emitting light on one side in the direct-lit application due to rectangular control light of a LED emitting light on four sides, which can reduce the number of LEDs and costs.

But the conventional LED emitting light on four sides adopts the flip-chip packaging technology. The cost of the flip-chip packaging technology is higher than the cost of chips with a common structure.

SUMMARY

Embodiments of the disclosure provide a display device and a LED emitting light on four sides thereof to solve the problem of high costs of the LED emitting light on four sides adopting the flip-chip packaging technology in the prior art.

In order to solve the problem above, the disclosure provides a LED emitting light on four sides. The LED emitting light on four sides includes metallic substrates, a transparent holder, a light emitting chip, golden lines, light emitting materials and a reflective white adhesive layer.

The metallic substrates include a first metallic substrate and a second metallic substrate disposed separately.

The transparent holder is fixated with external sides of the first metallic substrate and the second metallic substrate by thermoforming, and forms a containing cavity with surfaces of the first metallic substrate and the second metallic substrate.

The light emitting chip is across disposed on the first metallic substrate and the second metallic substrate.

The golden lines are electrically connecting the light emitting chip with the first metallic substrate and the second metallic substrate respectively.

The light emitting materials are filled in the containing cavity and covering the light emitting chip.

The reflective white adhesive layer is disposed on a top surface of the light emitting materials.

In order to solve the technical problem above, the disclosure further provides a display device. The display device includes a backlight module and a display module. The backlight module is configured to provide backlight to the display module. The backlight module employs the LED emitting light on four sides described above to be a light source.

Distinguishing from the prior art, the LED emitting light on four sides provided by the disclosure prevents the problem of high costs of manufacturing the LED emitting light on four sides by the flip-chip packaging technology in the prior art. The LED emitting light on four sides provided by the disclosure is simply manufactured and low in costs.

BRIEF DESCRIPTION OF THE DRAWINGS

In order to more clearly illustrate embodiments of the disclosure, following figures described in embodiments will be briefly introduced, it is obvious that the drawings are merely some embodiments of the disclosure, a person skilled in the art can obtain other figures according to these figures without creativity.

FIG. 1-2 is a top view of a LED emitting light on four sides according to an embodiment of the disclosure.

FIG. 1-3 is a right view of a LED emitting light on four sides according to an embodiment of the disclosure.

FIG. 1-4 is a front view of a LED emitting light on four sides according to an embodiment of the disclosure.

FIG. 1-5 is a left view of a LED emitting light on four sides according to an embodiment of the disclosure.

FIG. 1-6 is a rear view of a LED emitting light on four sides according to an embodiment of the disclosure.

FIG. 2 is a cross-sectional schematic view of the LED emitting light on four sides shown in FIG. 1-2 taken along A-A according to a first embodiment of the disclosure.

FIG. 3 is a cross-sectional schematic view of the LED emitting light on four sides shown in FIG. 1-2 taken along B-B according to the first embodiment of the disclosure.

FIG. 4 is a cross-sectional schematic view of the LED emitting light on four sides shown in FIG. 1-4 taken along C-C according to the first embodiment of the disclosure.

FIG. 5 is a cross-sectional schematic view of the LED emitting light on four sides shown in FIG. 1-2 taken along A-A according to a second embodiment of the disclosure.

FIG. 6 is a cross-sectional schematic view of the LED emitting light on four sides shown in FIG. 1-2 taken along B-B according to the second embodiment of the disclosure.

DETAILED DESCRIPTION OF PREFERRED EMBODIMENTS

In order to more clearly illustrate embodiments of the disclosure, following figures described in embodiments will be briefly introduced, it is obvious that the drawings are merely some embodiments of the disclosure, a person skilled in the art can obtain other figures according to these figures without creativity.

Figure 1:
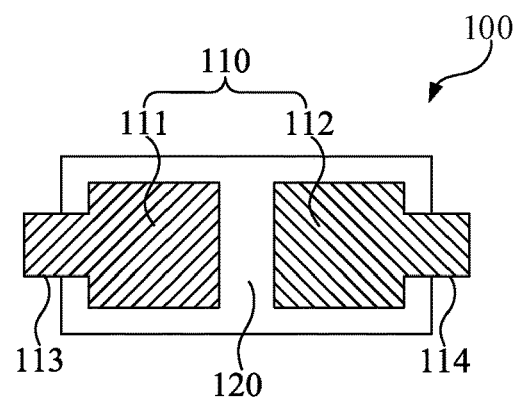
FIG. 1-1 is a bottom view of a LED emitting light on four sides according to an embodiment of the disclosure.
Figures 1, 2:
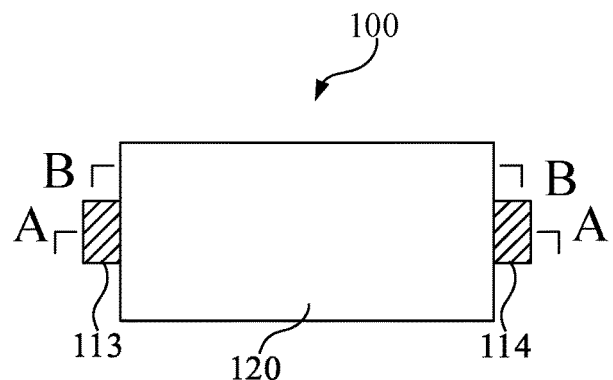
Figures 1, 2, 3:
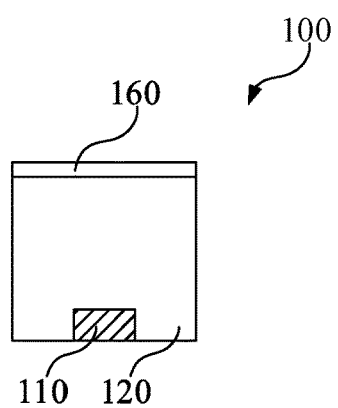
Figures 1, 2, 3, 4:
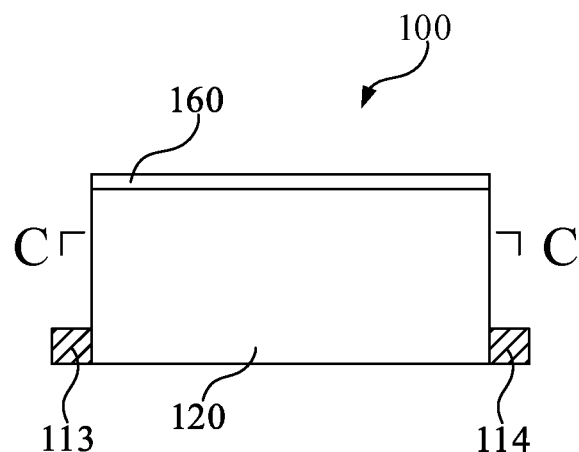

Referring to FIGS. 1-1~4, an embodiment of the disclosure provides a LED emitting light on four sides 100. The LED emitting light on four sides 100 includes metallic substrates 110, a transparent holder 120, a light emitting chip 130, golden lines 140, light emitting materials 150 and a reflective white adhesive layer 160.

FIGS. 1-1~1-6 are six basic views of the LED emitting light on four sides 100 provided by embodiments of the disclosure. It can be seen from FIGS. 1-1~1-6 that the LED emitting light on four sides 100 provided by the embodiments of the disclosure is a symmetrical structure. A left structure and a left structure of the LED emitting light on four sides 100 are identical; a front structure and a rear structure thereof are identical. Obviously, the structure of the LED emitting light on four sides provided by the disclosure is not restricted as such. In other embodiments, the LED emitting light on four sides can further be an asymmetrical structure.

In the embodiment of the disclosure, the metallic substrates 110 include a first metallic substrate 111 and a second metallic substrate 112 disposed separately. The metallic substrates 110 have a certain thickness with adoption of materials with relatively good conductivity, such as gold, silver, copper, aluminum, etc. The first metallic substrate 111 includes a first powering terminal 113 protruding the transparent holder 120. The second metallic substrate 112 includes a second powering terminal 114 protruding the transparent holder 120. The specific shapes and structures of the first metallic substrate 111, the second metallic substrate 112, the first powering terminal 113 and the second powering terminal 114 form limitations subject to the disclosure.

The transparent holder 120 is fixated with external sides of the first metallic substrate 111 and the second metallic substrate 112 by thermoforming, and forms a containing cavity with surfaces of the first metallic substrate 111 and the second metallic substrate 112. In a specific embodiment, the transparent holder 120 can be transparent plastic, transparent silica gel, transparent ceramic or transparent glass.

The light emitting chip 130 is across disposed on the first metallic substrate 111 and the second metallic substrate 112. In a specific embodiment, the light emitting chip 130 is a blue chip.

The golden lines 140 electrically connect the light emitting chip 130 with the first metallic substrate 111 and the second metallic substrate 112 respectively.

The light emitting materials 150 are filled in the containing cavity and covering the light emitting chip 130. In an embodiment, the light emitting materials 150 are fluorescent powders. The light emitting materials 150 are doped in silica gel 151 and further filled in the containing cavity.

The reflective white adhesive layer 160 is disposed on a top surface of the light emitting materials 150. In the embodiment of the disclosure, the reflective white adhesive layer 160 can adopt PA6T, PA9T, PCT, EMC or SMC material, which can be disposed on the top surface of the light emitting materials 150 by spray painting or attachment, and sealed with the top of the transparent holder 120.

As shown in FIG. 2 and FIG. 3, the transparent holder 120 includes trunk bulkheads 121 and a connecting arm 122 embedded in an interspace between the first metallic substrate 111 and the second metallic substrate 112. The transparent holder 120 is a "8" shape from the top view of the transparent holder 120, which is formed with two frames to surround the first metallic substrate 111 and the second metallic substrate 112, as the bottom view shown in FIG. 1-1.

In the first embodiment shown by FIG. 2 and FIG. 3, a cross-sectional area of the trunk bulkheads 121 decreases from the surfaces of the first metallic substrate 111 and the second metallic substrate 112 to the reflective white adhesive layer 160. The trunk bulkheads 121 integrally form a horn-shape, and the light emitting effect is excellent. Light is emitted from four sides of the transparent holder 120 after being reflected by the reflective white adhesive layer 160 on the top, the first metallic substrate 111 and the second metallic substrate 112 on the bottom.

Figures 1, 2, 3, 4, 5:
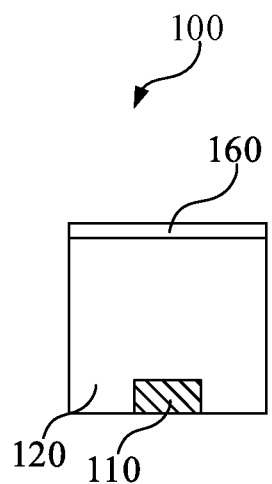
Figures 1, 2, 3, 4, 5, 6:
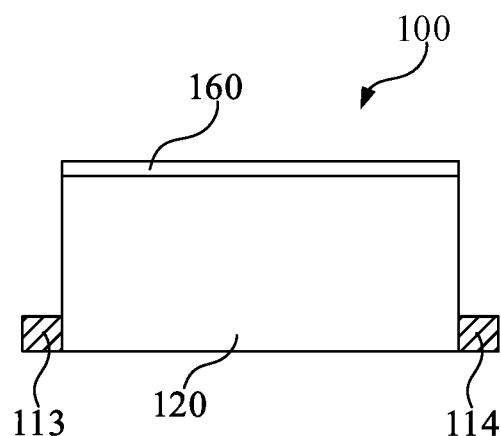
Figure 2:
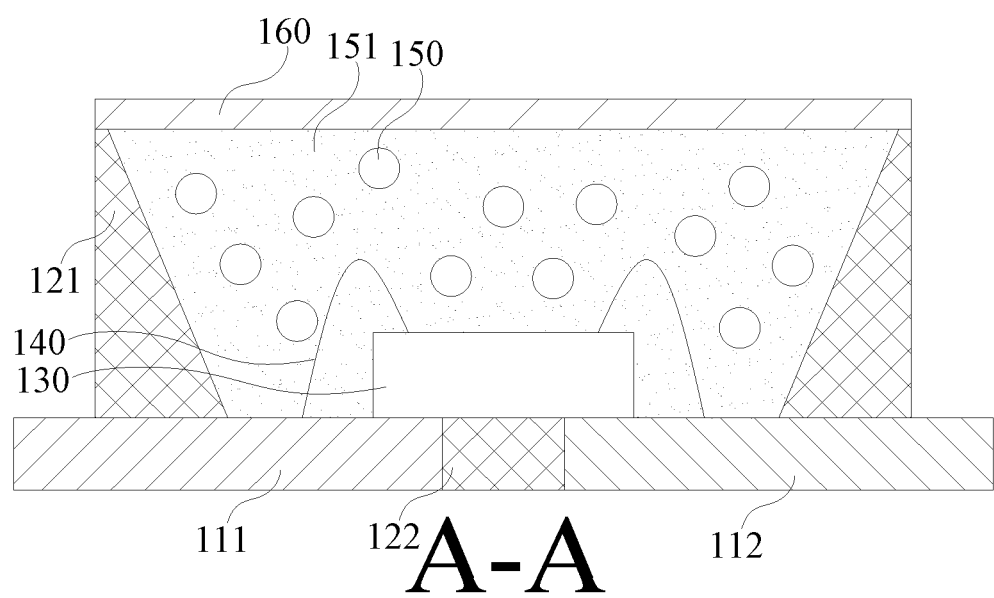
Figure 3:
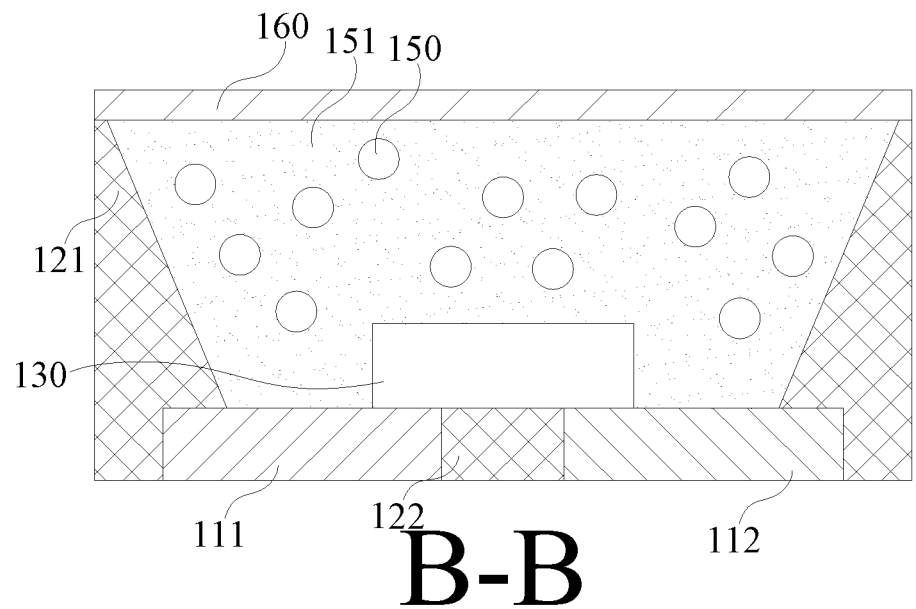
Figure 4:
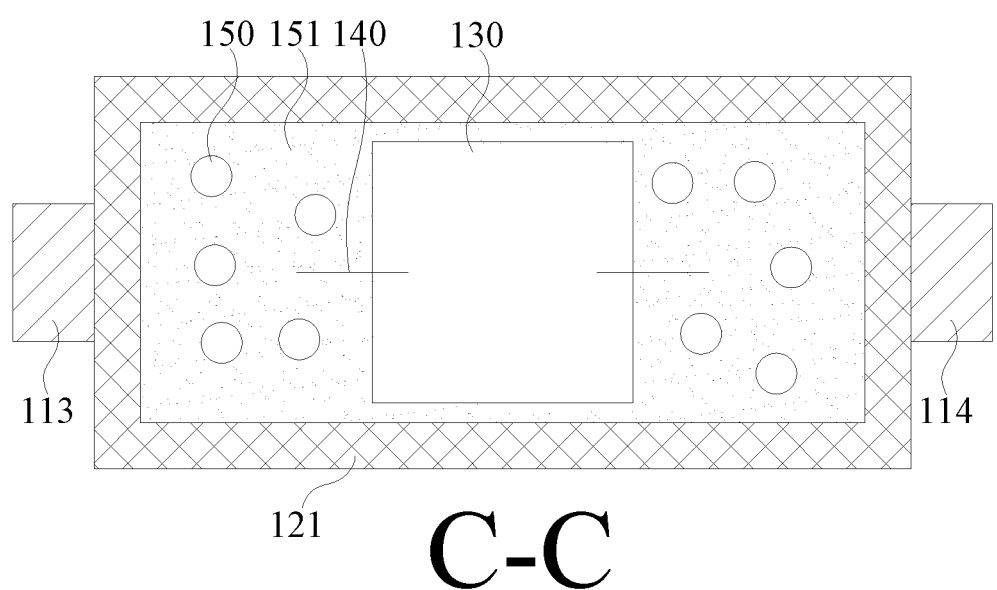
Figure 5:
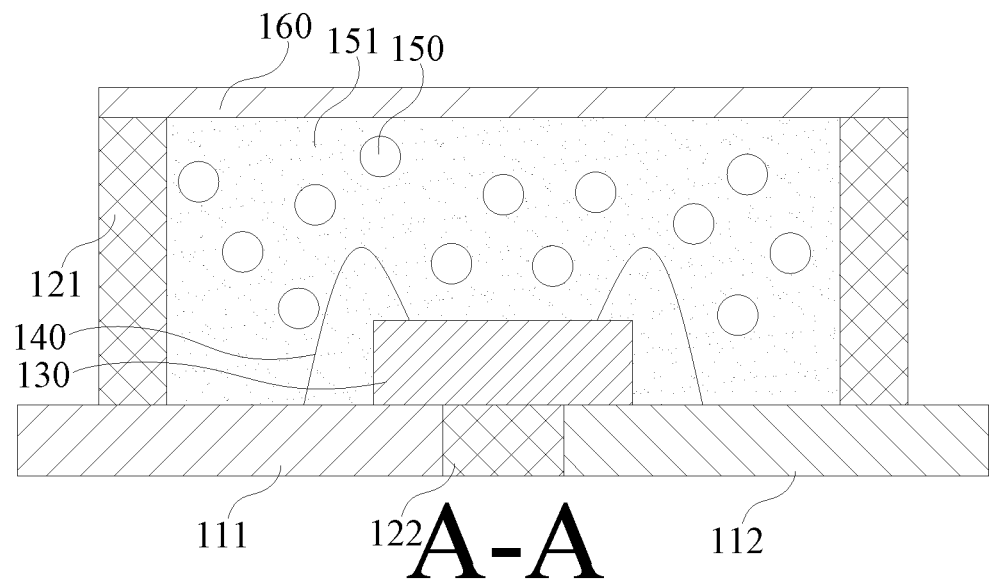
Figure 6:
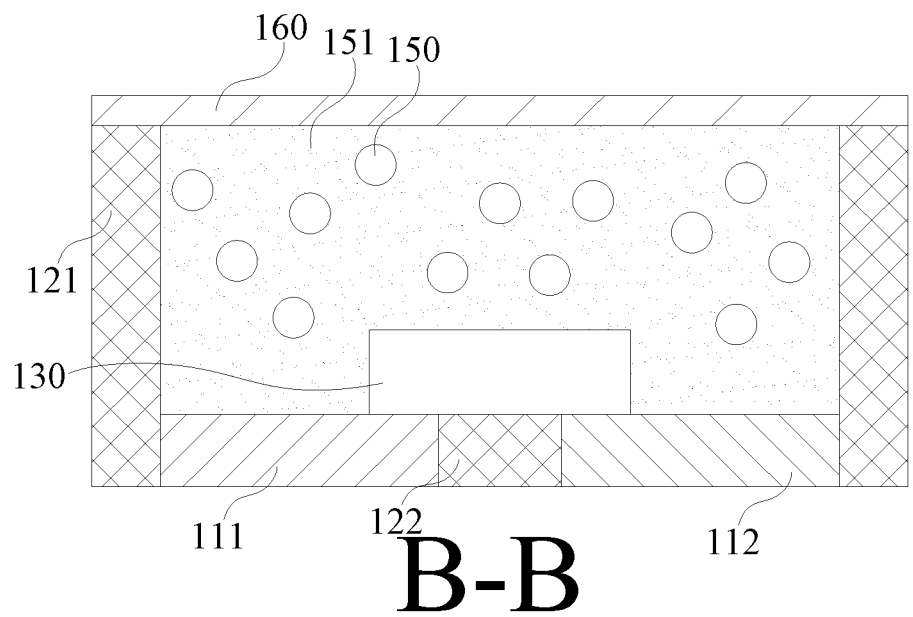

In the second embodiment shown by FIG. 5 and FIG. 6, the cross sections of the trunk bulkheads 121 can further be rectangular.

Figure 7:
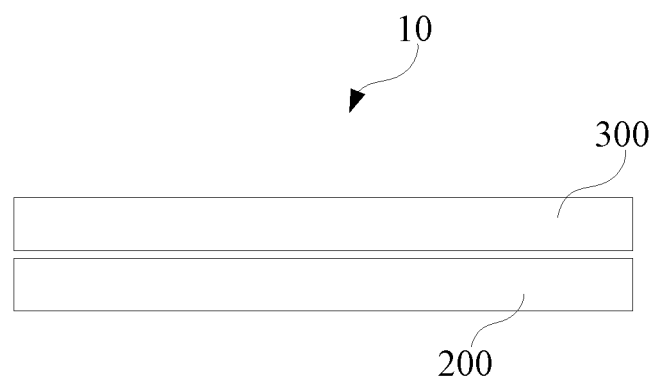
FIG. 7 is a simplified structural schematic view of a display device according to an embodiment of the disclosure.

Referring to FIG. 7 as well, the disclosure further provides a display device 10. The display device 10 includes a backlight module 200 and a display module 300. The backlight module 200 is configured to provide backlight to the display module 300. The backlight module 200 employs the LED emitting light on four sides 100 described above to be a light source.

In conclusion, it can be easily understood by a person skilled in the art that the LED emitting light on four sides 100 provided by the disclosure prevents the problem of high costs of manufacturing the LED emitting light on four sides 100 by the flip-chip packaging technology in the prior art. The LED emitting light on four sides 100 provided by the disclosure is simply manufactured and low in costs.

The description above is merely preferred embodiments of the disclosure, which cannot limit the protection scope of the disclosure. Any equivalent structure or process according to the disclosure directly or indirectly applied in other related fields should be included in the protected scope of the disclosure.

What is claimed is:

1. A LED emitting light on four sides, comprising:
   metallic substrates, comprising a first metallic substrate and a second metallic substrate disposed separately;
   a transparent holder, fixated with external sides of the first metallic substrate and the second metallic substrate by thermoforming, forming a containing cavity with surfaces of the first metallic substrate and the second metallic substrate;
   a light emitting chip, across disposed on the first metallic substrate and the second metallic substrate;
   golden lines, electrically connecting the light emitting chip with the first metallic substrate and the second metallic substrate respectively;
   light emitting materials, filled in the containing cavity and covering the light emitting chip;
   a reflective white adhesive layer, disposed on a top surface of the light emitting materials;
   the transparent holder comprising trunk bulkheads and a connecting arm embedded in an interspace between the first metallic substrate and the second metallic substrate; a cross-sectional area of the trunk bulkheads decreasing from the surfaces of the first metallic substrate and the second metallic substrate to the reflective white adhesive layer.

2. A LED emitting light on four sides, comprising:
   metallic substrates, comprising a first metallic substrate and a second metallic substrate disposed separately;
   a transparent holder, fixated with external sides of the first metallic substrate and the second metallic substrate by thermoforming, forming a containing cavity with surfaces of the first metallic substrate and the second metallic substrate;
   a light emitting chip, across disposed on the first metallic substrate and the second metallic substrate;
   golden lines, electrically connecting the light emitting chip with the first metallic substrate and the second metallic substrate respectively;
   light emitting materials, filled in the containing cavity and covering the light emitting chip;
   a reflective white adhesive layer, disposed on a top surface of the light emitting materials.

3. The LED emitting light on four sides according to claim 2, wherein the transparent holder is transparent plastic, transparent silica gel, transparent ceramic or transparent glass.

4. The LED emitting light on four sides according to claim 2, wherein the light emitting materials are doped in silica gel and further filled in the containing cavity.

5. The LED emitting light on four sides according to claim 2, wherein the reflective white adhesive layer adopts PA6T, PA9T, PCT, EMC or SMC material.

6. The LED emitting light on four sides according to claim 2, wherein the first metallic substrate comprises a first powering terminal protruding the transparent holder, the second metallic substrate comprises a second powering terminal protruding the transparent holder.

7. The LED emitting light on four sides according to claim 2, wherein the transparent holder comprises trunk bulkheads and a connecting arm embedded in an interspace between the first metallic substrate and the second metallic substrate.

8. The LED emitting light on four sides according to claim 7, wherein a cross-sectional area of the trunk bulkheads decreases from the surfaces of the first metallic substrate and the second metallic substrate to the reflective white adhesive layer.

9. The LED emitting light on four sides according to claim 7, wherein a cross section of the trunk bulkheads is rectangular.

10. The LED emitting light on four sides according to claim 2, wherein the light emitting chip is a blue chip, the light emitting materials are fluorescent powders.

11. A display device, comprising a backlight module and a display module, the backlight module configured to provide backlight to the display module, the backlight module employing a LED emitting light on four sides to be a light source, the LED emitting light on four sides comprising:
    metallic substrates, comprising a first metallic substrate and a second metallic substrate disposed separately;
    a transparent holder, fixated with external sides of the first metallic substrate and the second metallic substrate by thermoforming, forming a containing cavity with surfaces of the first metallic substrate and the second metallic substrate;
    a light emitting chip, across disposed on the first metallic substrate and the second metallic substrate;
    golden lines, electrically connecting the light emitting chip with the first metallic substrate and the second metallic substrate respectively;
    light emitting materials, filled in the containing cavity and covering the light emitting chip;
    a reflective white adhesive layer, disposed on a top surface of the light emitting materials.

12. The display device according to claim 11, wherein the transparent holder is transparent plastic, transparent silica gel, transparent ceramic or transparent glass.

13. The display device according to claim 11, wherein the light emitting materials are doped in silica gel and further filled in the containing cavity.

14. The display device according to claim 11, wherein the reflective white adhesive layer adopts PA6T, PA9T, PCT, EMC or SMC material.

15. The display device according to claim 11, wherein the first metallic substrate comprises a first powering terminal protruding the transparent holder, the second metallic substrate comprises a second powering terminal protruding the transparent holder.

16. The display device according to claim 11, wherein the transparent holder comprises trunk bulkheads and a connecting arm embedded in an interspace between the first metallic substrate and the second metallic substrate.

17. The display device according to claim 16, wherein a cross-sectional area of the trunk bulkheads decreases from the surfaces of the first metallic substrate and the second metallic substrate to the reflective white adhesive layer.

18. The display device according to claim 16, wherein a cross section of the trunk bulkheads is rectangular.

19. The display device according to claim 11, wherein the light emitting chip is a blue chip, the light emitting materials are fluorescent powders.

\* \* \* \* \*